United States Patent [19]

Fujii

[11] Patent Number: 4,742,381
[45] Date of Patent: May 3, 1988

[54] SEMICONDUCTOR CHARGE-COUPLED DEVICE WITH AN INCREASED SURFACE STATE

[75] Inventor: Ichiro Fujii, Miho, Japan

[73] Assignee: Texas Instruments Incorporated, Dallas, Tex.

[21] Appl. No.: 863,674

[22] Filed: May 15, 1986

[30] Foreign Application Priority Data

Jun. 21, 1985 [JP]  Japan .................. 60-136510

[51] Int. Cl.$^4$ ............ H01L 29/78; H01L 27/14; H01L 31/00; H01L 29/167
[52] U.S. Cl. .......................... 357/24; 357/30; 357/64; 357/91
[58] Field of Search ............ 357/24, 30, 63, 64, 357/91

[56] References Cited

U.S. PATENT DOCUMENTS

| | | | |
|---|---|---|---|
| 3,726,719 | 4/1973 | Brack et al. ............ | 357/47 |
| 4,151,011 | 4/1979 | Mihashi et al. ........ | 357/63 |
| 4,210,922 | 7/1980 | Shannon ................. | 357/24 LR |
| 4,240,843 | 12/1980 | Celler et al. ............ | 357/47 |
| 4,328,432 | 5/1982 | Yamazaki ............... | 357/24 LR |
| 4,485,315 | 11/1984 | Collet et al. ............ | 357/30 |
| 4,649,408 | 3/1987 | Sekine et al. .......... | 357/24 LR |

OTHER PUBLICATIONS

Anolick et al., "Reduction of Alpha Radiation Impact on CCD Memories" IBM Technical Disclosure Bulletin, vol. 22 (11/79) p. 2355.

Primary Examiner—Gene M. Munson
Attorney, Agent, or Firm—George L. Craig; James T. Comfort; Melvin Sharp

[57] ABSTRACT

A semiconductor charge-coupled device is fabricated with use of a layer of a doped semiconductor having an insulator layer thereon. Suitable dopant ions such as nitrogen or argon ions are implanted into the doped semiconductor layer so that the projected range of the ions introduced into the semiconductor layer is located substantially at the interface between the doped semiconductor layer and the insulator layer for forming an interlevel layer providing an increased surface state at the aforesaid interface. Where the interlevel layer is formed by implantation of nitrogen ions the structure having the nitrogen ions implanted into the doped semiconductor layer is preferably annealed at a relatively high temperature. The charge-coupled device may be designed either as the surface-channel type or as the buried-channel type with a single-phase, two-phase, three-phase or four-phase driving scheme.

4 Claims, 6 Drawing Sheets

SEMICONDUCTOR CHARGE-COUPLED DEVICE WITH AN INCREASED SURFACE STATE

FIELD OF THE INVENTION

The present invention relates in general to semiconductor devices and, particularly, to a semiconductor charge-coupled device. The present invention further relates to a process of an improved semiconductor charge-coupled device.

BACKGROUND OF THE INVENTION

Charge-coupled devices are broken down to two major categories depending upon the locations of the channel to be formed, including a category of surface-channel charge-coupled devices and a category of buried-channel charge-coupled devices. In terms of the driving scheme, on the other hand, there are charge-coupled devices of the single-phase, two-phase, three-phase and four-phase designs. A charge-coupled device of any of these types and designs is essentially a functional device constituted by a MOS structure providing a built-in scanning function and capabilities of storing information. Such a functional finds its typical applications in an image sensing array, an analog delay device, and a digital filter as well known in the art.

Known charge-coupled devices include a device having the capability of eliminating excess carriers for providing an effect to suppress the blooming which result from the carriers overflowing a pixel area included in the device. Charge-coupled devices having such anti-blooming capability include those which have vertical or horizontal overflow drain schemes and those which have surface regeneration schemes, both of which are well known in the art. Devices with the overflow drain schemes are however not fully acceptable for their anti-blooming capabilities which are susceptible to fabrication process variations which degrade the field of fabrication of the devices. Charge-coupled devices having the surface regeneration schemes are also not satisfactory because of their inadequate capabilities of suppressing the blooming phenomena although these devices can be fabricated with acceptable yields.

It is, accordingly, an important object of the present invention to provide a semiconductor charge-coupled device having a novel and saliently enhanced anti-blooming capability.

It is another important object of the present invention to provide a process of fabricating such an improved semiconductor charge-coupled device.

SUMMARY OF THE INVENTION

The present invention has been completed on the basis of the discovery of the fact that there does exist a certain correlation between the anti-blooming effect achievable of a charge-coupled device and the surface state at the silicon-silicon oxide interface, viz., the interface between the silicon substrate and the silicon dioxide layer on the substrate. It has thus been found that, on account of such a correlation, the anti-blooming capability of a charge-coupled device can be significantly enhanced by increasing the surface state at the silicon-silicon oxide interface either throughout the area of the interface or over selected areas of the interface. It has been further found that the enhancement of the anti-blooming ability of the device can be achieved by increasing the regeneration centers of carriers at the surface of the silicon substrate with no consequent increase in the dark current if the surface state at the silicon-silicon oxide interface is increased over selected areas of the interface.

In accordance with one outstanding aspect of the present invention, there is thus provided a semiconductor charge-coupled device comprising (a) a layer of a doped semiconductor, (b) an insulator layer on the doped semiconductor layer, (c) a plurality of transfer electrodes on the insulator layer, and (d) an interlevel layer providing a surface state with an increased surface state at the interface between the doped semiconductor layer and the insulator layer. The semiconductor charge-coupled device thus configured may further comprise (d) an anti-blooming electrode on the insulator layer, the anti-blooming electrode being substantially in registry with the interlevel layer. The interlevel layer may be formed either substantially throughout the area of the interface between the doped semiconductor layer and the insulator layer or simply over a selected area of the interface between the doped semiconductor layer and the insulator layer.

In accordance with another outstanding aspect of the present invention, there is provided a process of fabricating a semiconductor charge-coupled device, comprising (a) preparing a layer of a doped semiconductor having an insulator layer thereon, (b) introducing dopant ions into the doped semiconductor layer so that the projected range of the ions introduced into the semiconductor layer is located substantially at the interface between the doped semiconductor layer and the insulator layer for forming an interlevel layer providing an increased surface state at the aforesaid interface, and (c) forming a plurality of transfer electrodes on the insulator layer. The interlevel layer may be formed by implantation of nitrogen ions as the dopant ions into the doped semiconductor layer preferably followed by annealing of the structure having the nitrogen ions implanted into the doped semiconductor layer, or by implantation of argon ions as the dopant ions into the doped semiconductor layer.

BRIEF DESCRIPTION OF THE DRAWINGS

The features and advantages of a semiconductor charge-coupled device according to the present invention and a process of fabricating such a charge-coupled device in accordance with the present invention will be more clearly understood from the following description taken in conjunction with the accompanying drawings in which like reference numerals designate similar or corresponding structures, elements and regions and in which.

DESCRIPTION OF THE PREFERRED EMBODIMENTS

First Preferred Embodiment

Figure 1A:
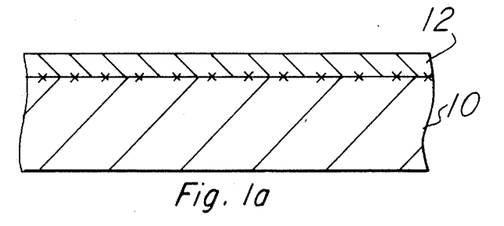
FIGS. 1A to 1D are fragmentary cross sectional views showing some of the successive steps for carrying out a first preferred embodiment of a process of fabricating a charge-coupled device in accordance with the present invention.
Figure 1B:
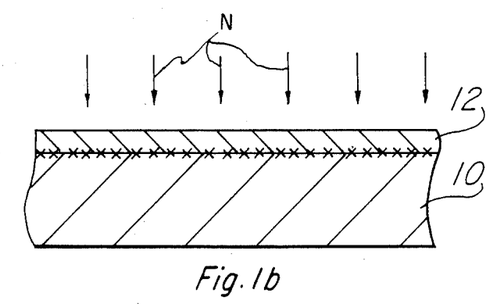

A first preferred embodiment of a process of fabricating a charge-coupled device in accordance with the present invention will now be described with reference to FIGS. 1A to 1D which show some of the successive steps for carrying out the process. Referring first to FIG. 1A, the first preferred embodiment of a process according to the present invention starts with preparation of a semiconductor substrate 10 of, for example, p-type silicon. The silicon substrate 10 has a silicon oxide film 12 which has been thermally oxidated or otherwise formed to an appropriate thickness to provide an insulator layer on the substrate 10. At the point of time when the silicon oxide film 12 is formed on the silicon substrate 10, there is a surface state having a certain density at the interface between the substrate 10 and the oxide film 12 as schematically indicated by a series of x's. Suitable donor-type ions such as typically nitrogen ions are implanted through the silicon oxide film 12 into the silicon substrate 10 as indicated by arrows N in FIG. 1B. This ion implantation process is performed using a relatively high dose of, for example, $3\times E15$ atoms/cm$^2$ to $1\times E10$ atoms/cm$^2$ with an RF energy selected such that the projected range $R_P$ of the implanted ions is located at or in proximity to the interface between the substrate 10 and the oxide film 12 as will be seen from the graphic representation of FIG. 2. The nitrogen ions thus implanted into the silicon substrate 10 give rise to an increase in the surface state at the interface between the substrate 10 and the oxide film 12 due to the discontinuities caused in the lattice structure of the silicon substrate by the implanted ions.

Figure 1C:
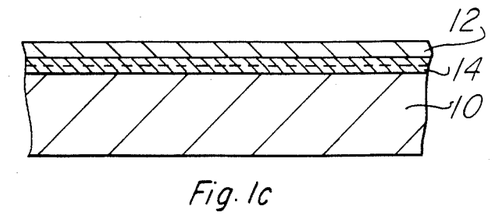
Figure 2:
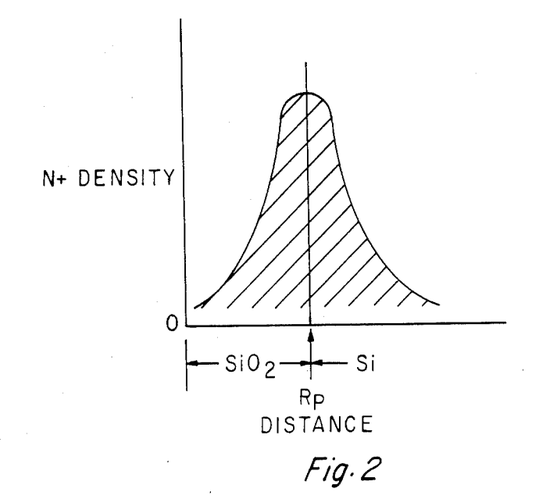
FIG. 2 is a graphic representation of the density distribution of the dopant ions implanted into the silicon substrate during the process step illustrated in FIG. 1B.

The resultant slice is subjected to high-temperature annealing at about 1000° C. for about 30 minutes to about 90 minutes in the atmosphere of nitrogen gas. This causes the implanted nitrogen ions to react with the silicon in the substrate 10 and the oxide film 12 and form an interlevel layer 14 of quasi silicon nitride (Si$_3$N$_4$) as shown in FIG. 1C. The formation of this quasi-nitride interlevel layer 14 has been ascertained by molecular bond analysis between the molecules of silicon and nitride.

The introduction of nitrogen ions into the silicon substrate 10 further gives rise to an increase in the surface state of the silicon-silicon oxide interface. This in turn leads to an increase in the regeneration centers of carriers at the surface of the silicon substrate 10 and thereby contributes to significant improvement in the anti-blooming effect of the device to be fabricated. As a matter of fact, it has been found that a charge-coupled device fabricated with the formation of the quasi-nitride interlevel layer 14 which serves as a surface-state modifier layer as discussed above provides an anti-blooming effect which is three to five times those achievable by ordinary charge-coupled devices. The anti-blooming capabilities of the devices were determined in terms of the quantity of light that caused blooming.

Figure 1D:
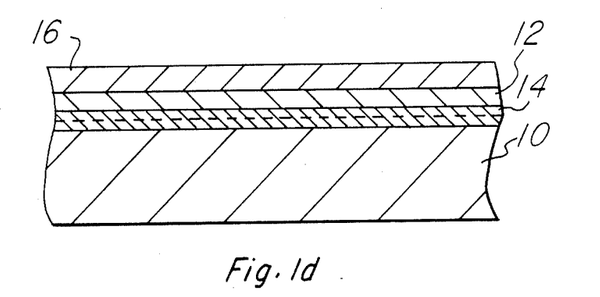

The annealing step is followed by formation of a heavily doped polysilicon layer 16 on the surface of the silicon oxide film 12 by, for example, chemical vapor deposition (CVD) techniques as shown in FIG. 1D. The doped polysilicon layer 16 is then patterned and photoetched to leave a plurality of parallel strips (not shown) arranged at predetermined intervals to form electrodes including anti-blooming electrodes as well as the ordinary transfer and bias electrodes.

It will be noteworthy that the quasi-nitride interlevel layer 14 to serve as the surface-state modifier layer in the device thus fabricated is created by a high-temperature annealing process. The benefit of the increased surface state at the silicon-silicon oxide interface could be achieved by mere implantation of nitrogen ions into the silicon substrate not followed by a high-temperature annealing step. The implanted nitrogen ions not only adds to the density of the surface state at the silicon-silicon oxide interface but also results in an increase in the production of dark current. It is for this reason of importance that the anti-blooming effect of a charge-coupled device be enhanced with concurrent suppression of the dark current. The growth of the quasi-nitride interlevel layer 14 as promoted by the high-temperature annealing step following the ion implantation process is effective to remedy the damage caused to the lattice structure of the silicon substrate 10 by the implanted nitrogen ions and to add to the regeneration centers without increasing the generation centers which are responsible for the formation of dark current. The increase in the dark current being thus suppressed, an image with excellent color tones and high contrast characteristics can be produced by the device used as, for example, an image sensing array. In addition, the various objectionable effects such as particularly the halation as caused due to the formation of excess carriers can be reliably precluded by reason of the enhanced anti-blooming capability of the image sensing array.

Second Preferred Embodiment

Figure 3A:
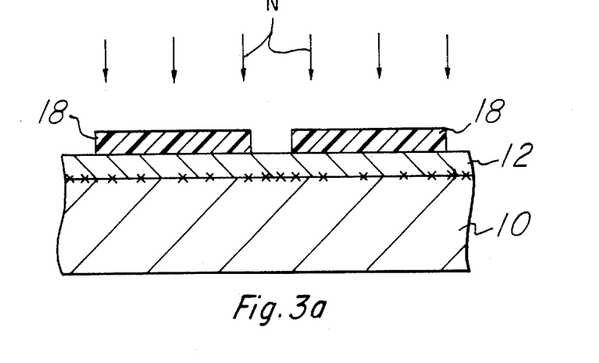
FIGS. 3A to 3C are fragmentary cross sectional views showing some of the successive steps for carrying out a second preferred embodiment of a process of fabricating a charge-coupled coupled device in accordance with the present invention.

FIGS. 3A to 3C show some of the steps for carrying out a second preferred embodiment of a process according to the present invention. As shown in FIG. 3A, a semiconductor substrate 10 of, for example, p-type silicon with a silicon oxide film 12 formed at one surface thereof is also used in the second preferred embodiment of a process according to the present invention. As discussed in connection with the process shown in FIGS. 1A to 1D, a surface state including a certain density is induced at the interface between the substrate 10 and the oxide film 12 at the point of time when the silicon oxide film 12 is formed on the silicon substrate 10 as indicated by a series of x's. A suitable photoresist is then spun on uniformly to the surface of the silicon oxide film 12, followed by patterning and etching of the photoresist coating to leave an appropriately patterned photoresist mask layer 18. Dopant ions such as nitrogen ions are implanted through the silicon oxide film 12 into unmasked regions of the silicon substrate 10 as indicated by arrows N. This ion implantation process may be performed under conditions similar to those used in the first preferred embodiment of a process according to the present invention so that the projected range $R_P$ of the implanted ions is located at or in proximity to the interface between the substrate 10 and the oxide film 12. The nitrogen ions thus implanted into the selected areas of the silicon substrate 10 increase the surface state at the silicon-silicon oxide interface over the particular areas while the surface state of the remaining, viz., masked regions of the substrate 10 is maintained unchanged. It is the resultant structure that is illustrated in FIG. 3A.

Figure 3B:
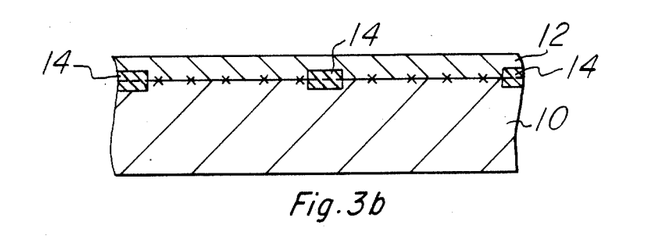

After the photoresist mask layer 18 is stripped, the slice is annealed typically under conditions similar to those used in the first preferred embodiment of a process according to the present invention. The nitrogen ions which have been implanted into the slice are thus caused to react with the silicon in the substrate 10 and the oxide film 12 and form a patterned interlevel layer 14 of quasi silicon nitride over the selected areas of the silicon-silicon oxide interface, as shown in FIG. 3B. As noted previously, the surface state at the silicon-silicon oxide interface further increases as a result of the introduction of nitrogen ions into the silicon substrate 10 and contributes to improvement in the anti-blooming effect of the device to be fabricated.

Figure 3C:
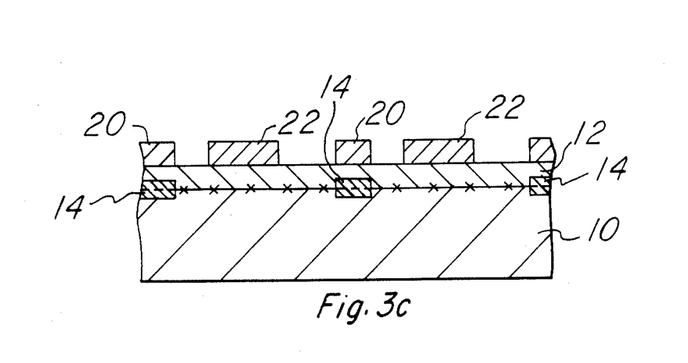

A heavily doped polysilicon layer is then formed on the surface of the silicon oxide film 12 typically by chemical vapor deposition techniques and is patterned and etched to leave a plurality of electrodes which are spaced apart at predetermined intervals from each other. As shown in FIG. 3C, these electrodes may include anti-blooming electrodes 20 located over the patterned quasi-nitride interlevel layer 14 and transfer electrodes 22 each intervening between the neighboring anti-blooming electrodes 20. Thus, the charge-coupled device fabricated by the second preferred embodiment of a process according to the present invention has a surface state with energy levels greater in number at the silicon-silicon oxide interface over areas underlying the anti-blooming electrodes 20 than at the silicon-silicon oxide interface over areas underlying the transfer electrodes 22. Not only an enhanced anti-blooming capability is achieved by the locally increased surface state at the silicon-silicon oxide interface but also significant reduction is achieved in the dark current due to the presence of the patterned quasi-nitride interlevel layer 14. Production of the dark current is also suppressed with the smaller number of energy levels at the silicon-silicon oxide interface underlying the transfer electrodes 22.

Third Preferred Embodiment

Figure 4A:
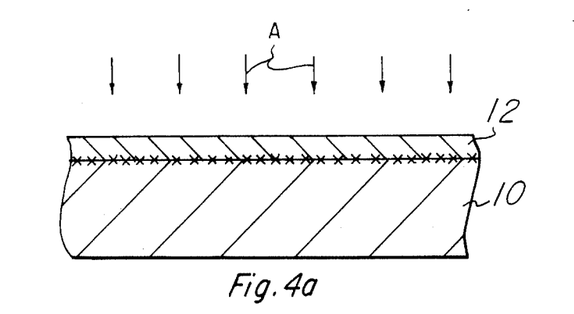
FIGS. 4A and 4B are fragmentary cross sectional views showing some of the successive steps for carrying out a third preferred embodiment of a process of fabricating a charge-coupled device in accordance with the present invention.
Figure 4B:
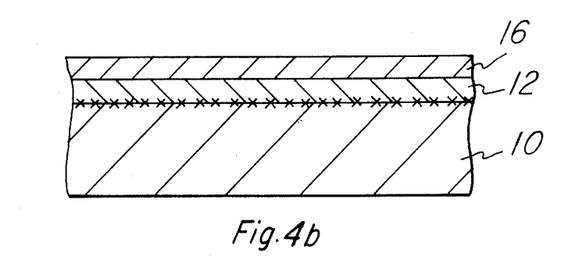

FIGS. 4A and 4B show steps for carrying out a third preferred embodiment of a process according to the present invention. Also used in this embodiment is a semiconductor substrate 10 of, for example, p-type silicon with a silicon oxide film 12 formed at one surface thereof, as shown in FIG. 4A. A series of x's also indicates the surface state induced at the interface between the substrate 10 and the oxide film 12 when the silicon oxide film 12 is formed on the silicon substrate 10.

In the third preferred embodiment of a process according to the present invention, argon is used to increase the surface state at the silicon-silicon oxide interface. For this purpose, argon ions are implanted through the silicon oxide film 12 into the silicon substrate 10 as indicated by arrows A in FIG. 4A. This ion implantation process may be performed with a dose of $1\times10E$ atoms/cm$^2$ with other conditions selected so that the projected range $R_P$ of the implanted ions is located at or in proximity to the interface between the substrate 10 and the oxide film 12. The argon ions thus implanted into the silicon substrate 10 also result in formation of more lattice discontinuities at the interface between the substrate 10 and the oxide film 12, thus forming a surface-state modifier layer (not shown) providing an increased surface state at the silicon-silicon oxide interface. Because of the atomic weight of argon which is greater than that of nitrogen, more serious damage is caused to the lattice structure of the silicon substrate than the damage which result from implantation of nitrogen ions and is for this reason more effective to enhance the anti-blooming capability of the device to result. On the resultant structure is formed a heavily doped polysilicon layer 16 typically by chemical vapor deposition techniques as shown in FIG. 4B. This polysilicon layer 16 is patterned and etched to leave a plurality of spaced parallel electrodes which may include as electrodes as well as transfer and bias electrodes, though not shown in the drawings.

Figure 5:
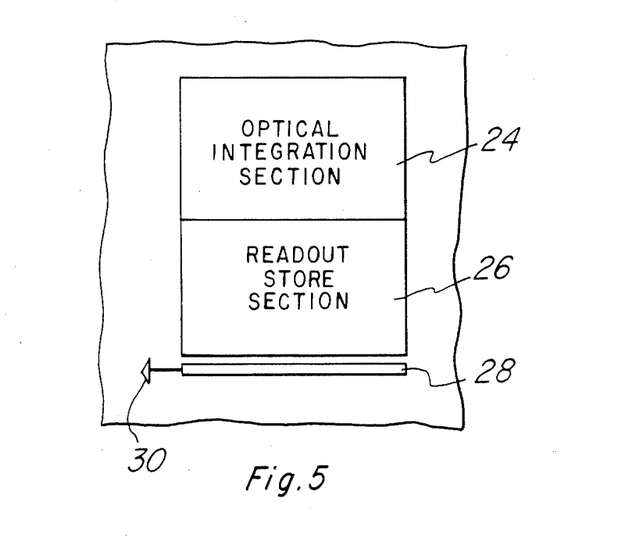
FIG. 5 is a fragmentary plan view schematically showing the general layout of a frame-transfer image sensing array.

While a charge-coupled device embodying the present invention may find a variety of potential applications, typical of such applications is an image sensing array. FIG. 5 of the drawings schematically shows the general layout of an image sensing array organized to operate in the "frame-transfer" mode. As well known in the art, an ordinary frame-transfer image sensing array largely consists of three functional sections. One of these functional sections is an optical integration section 24 onto which light is to be incident and in which the carriers generated by irradiation with the light are to be collected. Another functional section is an information readout store section 26 into which the whole frame of information is to be moved with all the electrodes pulsed at the end of the optical integration period. A third functional section of the image sensing array is a serial output register section 28 into which the information stored in the readout store section 26 is to be sequentially read and from which the information thus read out is to be horizontally transferred through an output diode (not shown) to an amplifier 30. Each of these optical integration section 24, readout store section 26 and output register section 28 is composed of a two-dimensional subarray of a myriad of charge-coupled devices of, for example, the buried channel type.

Figure 6:
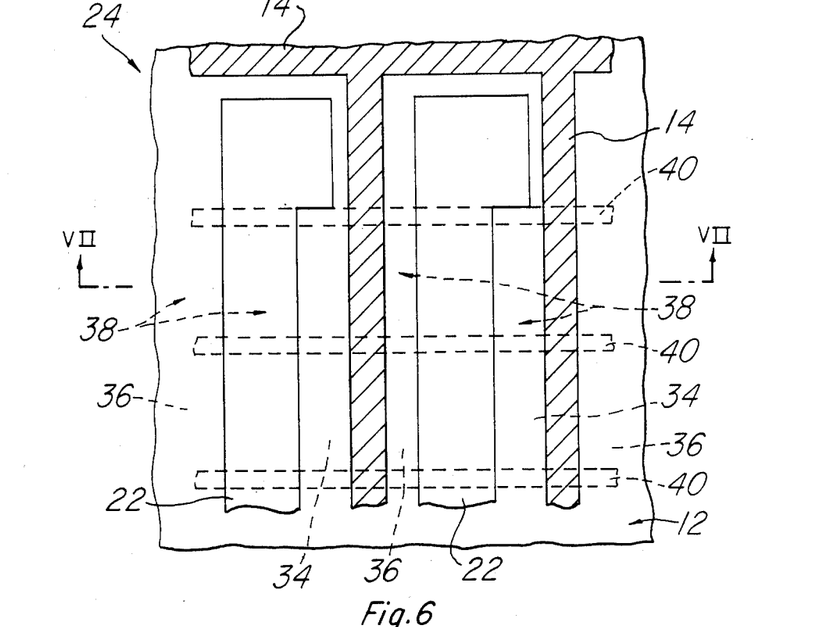
FIG. 6 is a fragmentary plan view showing, to an enlarged scale, a portion of the optical integration section which forms part of the image sensing array illustrated in FIG. 5.
Figure 7:
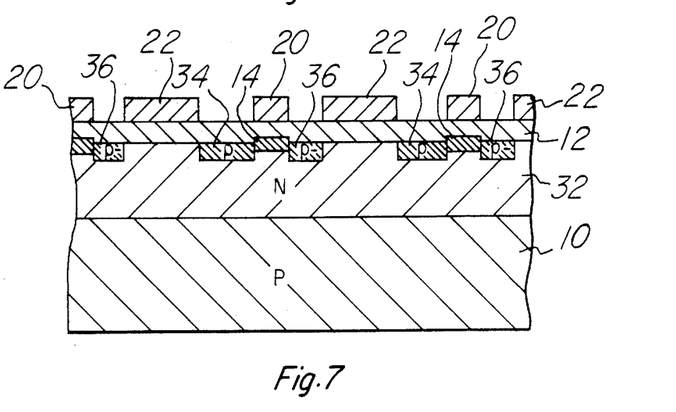
FIG. 7 is a cross sectional view taken along line VII—VII in FIG. 6.

FIGS. 6 and 7 of the drawings show the cross sectional configuration of a portion of the optical integration section 24 of the image sensing array thus constructed. The device herein shown is assumed to form part of a single-phase device known as virtual-phase charge-coupled device.

The optical integration section 24 of the image sensing array as herein shown comprises a silicon substrate 10 of p-type silicon having an overlying n-type silicon layer 32 as will be better seen from FIG. 7. This n-type silicon layer 32 may be formed as a well in the silicon substrate 10 and is to provide a buried channel therethrough. The n-type silicon layer 32 is overlain by a silicon oxide film 12. In the n-type silicon layer 32 are formed a plurality of first p-type silicon regions 34 and a plurality of second p-type silicon regions 36 which merge in plan with the first p-type silicon regions 34. The first and second p-type silicon regions 34 and 36 are appropriately patterned and arranged at predetermined intervals in plan and provide virtual electrode regions 38 extending in directions in which the transfer electrodes of the device are to extend as will be seen from in FIG. 6. The first and second p-type silicon regions 34 and 36 are doped differentially, with the first p-type silicon regions 34 doped more heavily than the second p-type silicon regions 36 as indicated by "P" and "P−" for the regions 34 and 36, respectively. Thus, the virtual electrode regions 38 formed by the first p-type silicon regions 34 are to build up in the n-type silicon layer 32 a predetermined potential higher than a predetermined potential to be built up in the n-type silicon layer 32 by the virtual electrode regions 38 formed by the second p-type silicon regions 36. The n-type silicon layer 32 also has formed therein a plurality of p+-type channel stop regions 40 extending in directions perpendicular to directions of elongation of the p-type silicon regions 34 and 36 as indicated by broken lines in FIG. 6.

Dopant ions such as nitrogen or argon ions are implanted through the silicon oxide film 12 into selected areas of the n-type silicon layer 32 so that the projected range of the implanted ions is located at or in proximity to the interface between the n-type silicon layer 32 and the oxide film 12. As will be readily seen from FIG. 7, these selected areas of the n-type silicon layer 32 are located to intervene between each pair of the associated first and second p-type silicon regions 34 and 36. The nitrogen or argon ions thus implanted into the selected areas of the n-type silicon layer 32 give rise to an increase in the surface state at the silicon-silicon oxide interface over the selected areas of the layer 32 while the surface state of the remaining regions of the n-type silicon layer 32 is maintained unchanged as in the second preferred embodiment of a process according to the present invention. Where nitrogen is used as the dopant, the resultant slice is annealed at a high temperature to cause the implanted nitrogen ions to react with the silicon in the n-type silicon layer 32 and the oxide film 12. A patterned interlevel layer 14 providing an increased surface state at the silicon-silicon oxide interface is thus formed between the paired first and second p-type silicon regions 34 and 36 forming the virtual electrode regions 38 in the n-type silicon layer 32, as indicated by areas shown hatched in FIG. 6. The interlevel layer 14 may be extensive in plan to extend into the areas of the other charge-coupled devices forming the optical integration section 24 of the image sensing array, though not shown in the drawings.

On the silicon oxide film 12 is provided a plurality of electrodes of heavily doped polysilicon. These electrodes are shown including anti-blooming electrodes 20 located over the patterned interlevel layer 14 and transfer electrodes 22 which alternate the individual anti-blooming electrodes 20. The anti-blooming electrodes 20 serve to take up or eliminate excess carriers which may be produced in the channel in the n-type layer 32 during operation of the device. The anti-blooming electrodes 20 are not shown in FIG. 6 to place a stress on the interlevel layer 14 providing the increased energy levels in the surface state at the silicon-silicon oxide interface.

Figure 8:
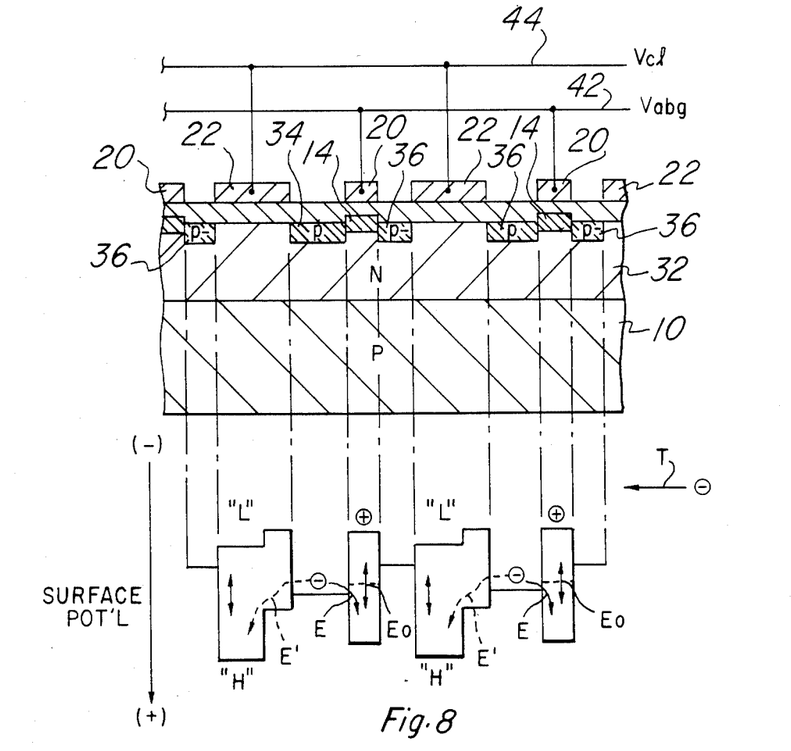
FIG. 8 is a view largely similar in part to FIG. 7 but additionally shows in its lower half section the distribution of the surface potentials of the channel-forming silicon layer which forms part of the device depicted in FIGS. 6 and 7.

Description will now be made in regard to the operation of the virtual-phase charge-coupled device configured as above described in the optical integration section 24 of the image sensing array, reference being had to FIGS. 6 and 7 and further to FIG. 8. The upper half of FIG. 8 is similar to FIG. 7 depicting the cross sectional configuration of the device portion of the integration section 24. The lower half of FIG. 8 shows the distribution of the surface potentials of the channel-forming n-type silicon layer 32, the surface potential being shown higher and positive downward and lower and negative upward. In the lower half of FIG. 8, electrons which are to act as majority carriers are indicated with a minus sign "−" enclosed in a bubble and holes which are generated by irradiation with light are indicated with a plus sign "+" enclosed in a bubble. The predetermined potentials to be built up by the first and second p-type silicon regions 34 and 36 are indicated by $E_1$ and $E_2$, respectively, in the lower half of FIG. 8). In the upper half of FIG. 8, the anti-blooming electrodes 20 are shown connected to a common clock line 44 leading from a source of clock pulses $V_{abg}$ and the transfer electrodes 22 shown connected to a common clock line 46 leading from a source of clock pulses $V_{cl}$. It is further assumed, by way of example, that electrons as the majority carriers are to be horizontally transferred through the n-type silicon layer 32 in the direction of arrow T in FIG. 8.

During an integration mode in which the optical integration section 24 is being irradiated with light, there is no clock pulses $V_{cl}$ applied to the transfer electrodes 22 to establish a low potential level "L" at the surface of the n-type silicon. On the other hand, the anti-blooming elctrodes 20 are switched between high and low levels "H" and "L" by the clock pulses $V_{abg}$ applied to the electrodes through the line 42. As the potential level at the surface of the n-type silicon layer 32 thus swings to the high level "H" below the anti-blooming electrodes 20, the electrons located below the virtual electrodes 38, viz., first and second p-type silicon regions 34 and 36 are partially collected in the high energy level regions created below the anti-blooming electrodes 20 as indicated by arrows E in the lower half of FIG. 8. The electrons thus collected below the anti-blooming electrodes 20 are trapped within the high energy level regions by the high potential level at the silicon-silicon oxide interface associated with the interlevel layer 14. When the potential level at the surface of the n-type silicon layer 32 thereafter shifts to the low level "L" below the anti-blooming electrodes 20, the trapped electrons recombine at the surface of the silicon layer 32 with the holes generated by the incident light and are caused to disappear. It therefore follows that a charge-pumping current flows through the n-type silicon layer 32 with excess electrons taken up or eliminated below the anti-blooming electrodes 20. This prevents an occurrence of halation that would otherwise be caused by the presence of excess carriers or electrons.

At the end of the integration mode, there is no clock pulses $V_{abg}$ applied to the anti-blooming electrodes 20 to establish at the surface of the n-type silicon 32 a certain intermediate potential level indicated by dotted lines Eo in the lower half of FIG. 8. The potential level Eo thus established by the anti-blooming electrodes 20 is assumed to be lower and higher than the potential levels $E_1$ and $E_2$ built up by the first and second p-type silicon regions 34 and 36, respectively. On the other hand, the transfer electrodes 22 are switched between high and low levels "H" and "L" by the clock pulses $V_{cl}$ applied to the electrodes through the line 44. In response to the high potential level "H" built up at the surface of the n-type silicon layer 32 below the transfer electrodes 22, the electrons located below the virtual electrodes 38 are moved to the high energy level regions now created below the transfer electrodes 22 as indicated by arrows E' in dotted lines in the lower half of FIG. 8. When the potential level at the surface of the n-type silicon layer 32 thereafter shifts to the low level "L" below the transfer electrodes 22, the electrons in each of the regions below the transfer electrodes 22 are caused to move in the direction of arrow T through the regions below the adjacent, viz., immediately left second p-type silicon region 36 and the associated anti-blooming electrode 20 to the region below the first p-type silicon region 34 ahead of the region below the next transfer electrode 22. The electrons thus transferred to the region below the first p-type silicon region 34 ahead of the region below the next transfer electrode 22 are moved to the high energy level region created below the particular transfer electrode 22 when the voltage applied to the electrode 22 thereafter shifts to the high level "H". It may be noted that each of the regions of the n-type silicon layer 32 which underly the transfer electrodes 22 preferably provides different surface potential levels which are stepwise higher in the direction of arrow T in which electrons are to be transferred as will be seen from the lower half of FIG. 8. Such stepwise distribution of the surface potential in the regions of the n-type silicon layer 32 below the transfer electrodes 22 can be implemented by the use of differential doping for the silicon layer 32.

As will have been understood from the foregoing description that the patterned interlevel layer 14 provided at the interface between the n-type silicon layer 32 and the silicon oxide film 12 is effective to increase the surface state at the silicon-silicon oxide interface. The surface state with such an increased number of energy levels lends itself to having more electrons trapped within the regions of the n-type silicon layer 32 below the the interlevel layer 14 and recombined with and extinguished by the holes generated by the light picked up by the integration section 24. This provides an enhanced anti-blooming capability for a charge-coupled device according to the present invention. The number of the surface state energy levels thus augmented by the provision of the interlevel layer 14 can be adjusted by selecting the dose and/or the RF energy to be used for the implantation of ions to form the layer 14. This provides ease and accuracy of control over the anti-blooming capability to be achieved of the charge-coupled device to be fabricated. Without the formation of the interlevel layer 14, the surface state at the silicon-silicon oxide interface of the device would include only a limited, small number of energy levels so that the device could not provide a satisfactory anti-blooming capability. Because, furthermore, of the fact that there is no surface-state modifier region provided below each of the transfer electrodes 22, there will be no risk or penalty of producing additional dark current that would otherwise impair the performance characteristics of the device.

Figure 9:
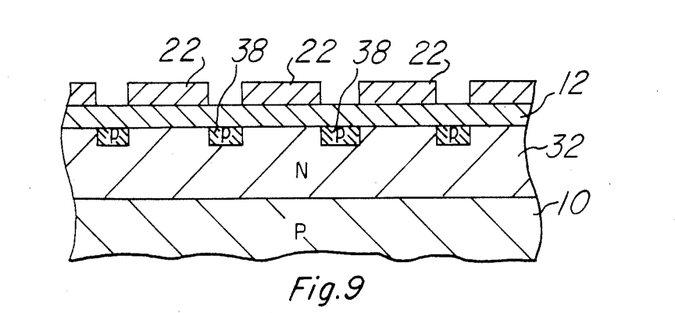
FIG. 9 is a fragmentary cross sectional view showing an example of the cross sectional configuration of the readout store section of the image sensing array illustrated in FIG. 5.

FIG. 9 of the drawings shows an example of the cross sectional configuration of the readout store section 26 of the image sensing array illustrated in FIG. 5. The readout store section 26 is herein shown configured similarly to the optical integration section 24 except in that the interlevel layer 14 and associated anti-blooming electrodes 20 provided in the latter are dispensed with in the former. Each of the islands of the p-type regions which form the virtual electrodes 38 in the n-type silicon layer 32 is thus shown located to intervene between the regions of the layer 32 which underly every adjacent two of the transfer electrodes 22. The transfer electrodes 22 for use in this readout store section 26 may be formed by a metallized layer of, for example, aluminum rather than doped polysilicon.

While some preferred embodiments of a device according to the present invention and some preferred embodiments of a process of fabricating such a device in accordance with the present invention have thus far been described and shown, it should be borne in mind that such embodiments are simply illustrative of the gist of the present invention and are therefore subject to modification and change. While, for example, the interlevel layer 14 in the embodiment shown in FIGS. 6 and 7 is formed simply over the selected areas of the silicon-silicon oxide interface may be formed substantially throughout the area of the silicon-silicon oxide interface. Such an interlevel layer 14 coextensive with the silicon-silicon oxide interface may be formed by implantation of nitrogen ions followed by a high-temperature annealing process as discussed in connection with the embodiment of FIGS. 1A to 1D. It may be further apparent that the materials which have been specified for the various layers of the described embodiments may be substituted by any other appropriate substances and/or may be doped to conductivity types opposite to those which have been specified. Although, furthermore, the charge-coupled device shown in FIGS. 6 and 7 has been assumed to be of the buried-channel single-phase driven type, a charge-coupled device according to the present invention or a charge-coupled device which may be fabricated by a process according to the present invention may be of the two-phase, three-phase or four-phase type and/or of the surface-channel design if desired.

What is claimed is:

1. A semiconductor charge-coupled device comprising:
   (a) a layer of a doped semiconductor,
   (b) an insulator layer on the doped semiconductor layer,
   (c) a plurality of transfer electrodes on the insulator layer, and
   (d) an interlevel layer formed over a selected area of said interface between said doped semiconductor layer and said insulator layer to increase the surface state at said interface,
   (e) an anti-blooming electrode on said insulator layer substantially in registry with said selected area of said interface between said doped semiconductor layer and said insulator layer and intervening between an adjacent two of said transfer electrodes along the surface of said insulator layer,
   (f) first and second doped semiconductor regions in said doped semiconductor layer and doped to the same conductivity type to different dopant densities and located so that said interlevel layer intervenes therebetween along said interface between said doped semiconductor layer and said insulator layer.

2. A semiconductor charge-coupled device as set forth in claim 1, in which said semiconductor layer is doped to one conductivity type and each of said first and second doped semiconductor regions is doped to the other conductivity type.

3. A semiconductor charge-coupled device as set forth in claim 1, in which said interlevel layer contains ion-implanted nitrogen.

4. A semiconductor charge-coupled device as set forth in claim 1, in which said interlevel layer contains ion-implanted argon.

* * * * *